United States Patent
Giner De Haro et al.

(10) Patent No.: US 10,979,019 B2
(45) Date of Patent: Apr. 13, 2021

(54) RECONFIGURABLE RESONATOR DEVICES, METHODS OF FORMING RECONFIGURABLE RESONATOR DEVICES, AND OPERATIONS THEREOF

(71) Applicant: GLOBALFOUNDRIES Singapore Pte. Ltd., Singapore (SG)

(72) Inventors: Joan Josep Giner De Haro, Singapore (SG); Humberto Campanella Pineda, Cork (IE)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 26 days.

(21) Appl. No.: 16/437,032

(22) Filed: Jun. 11, 2019

(65) Prior Publication Data

US 2020/0395915 A1 Dec. 17, 2020

(51) Int. Cl.
*H03H 9/24* (2006.01)
*H03H 9/02* (2006.01)
*H03H 3/007* (2006.01)

(52) U.S. Cl.
CPC ........ *H03H 9/2426* (2013.01); *H03H 3/0073* (2013.01); *H03H 9/02275* (2013.01)

(58) Field of Classification Search
CPC . H03H 9/2426; H03H 9/02275; H03H 3/0073
See application file for complete search history.

(56) References Cited

U.S. PATENT DOCUMENTS

| 5,821,833 A | 10/1998 | Lakin | |
|---|---|---|---|
| 6,204,737 B1 * | 3/2001 | Ella | H01P 1/127 310/321 |
| 6,242,843 B1 * | 6/2001 | Pohjonen | H01P 1/127 310/313 R |
| 6,522,047 B1 | 2/2003 | Toda | |

(Continued)

FOREIGN PATENT DOCUMENTS

FR 3018969 A1 * 9/2015 ........... H03H 7/0153

OTHER PUBLICATIONS

Baraka et al., "Reconfiguration of Bulk Acoustic Wave filters using RF-MEMS switches and CMOS transistors", Proceedings of the 8th IEEE International NEWCAS Conference 2010 (pp. 169-172). (Year: 2010).*

*Primary Examiner* — Emily P Pham
(74) *Attorney, Agent, or Firm* — Viering Jentschura & Partner MBB

(57) ABSTRACT

A resonator device may include a stacked first resonator and second resonator. The first resonator may be configured to resonate at a first operating frequency, and the second resonator may be configured to resonate at a second operating frequency different from the first operating frequency. The first resonator may include a first electrode and a first active layer arranged over the first electrode. The second resonator may include a second active layer arranged over the first active layer, and a second electrode arranged over the second active layer. The stacked first resonator and second resonator may be coupled to a reconfiguration switch (Continued)

for selectively operating at the first operating frequency or the second operating frequency. One of the first resonator and the second resonator is active upon selection by the reconfiguration switch, while the other resonator is inactive.

20 Claims, 14 Drawing Sheets

(56) References Cited

U.S. PATENT DOCUMENTS

| | | | |
|---|---|---|---|
| 6,927,651 B2 | 8/2005 | Larson, III et al. | |
| 7,986,198 B2 | 7/2011 | Nakatsuka et al. | |
| 8,665,038 B2 | 3/2014 | Belot et al. | |
| 10,756,768 B2* | 8/2020 | Miyazaki | H04B 1/00 |
| 2017/0187347 A1 | 6/2017 | Rinaldi et al. | |
| 2018/0041190 A1* | 2/2018 | Yoshimura | H03H 9/725 |
| 2018/0152172 A1* | 5/2018 | Takeuchi | H03H 9/725 |
| 2018/0227006 A1* | 8/2018 | Yasuda | H04W 76/15 |
| 2020/0021275 A1* | 1/2020 | Ueno | H03H 9/14552 |
| 2020/0195230 A1* | 6/2020 | Nosaka | H03H 9/6403 |
| 2020/0228151 A1* | 7/2020 | Naniwa | H04B 1/44 |

\* cited by examiner

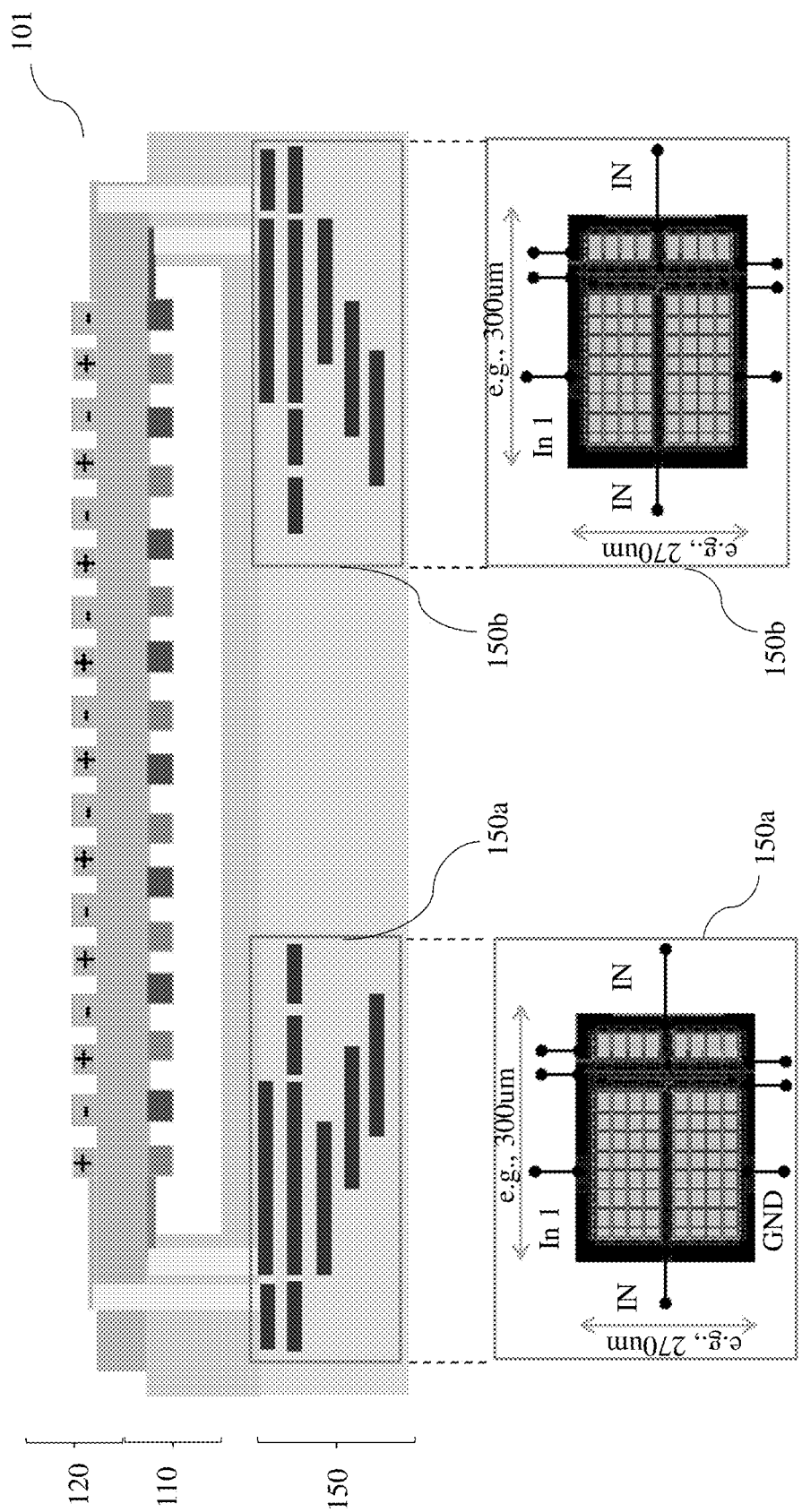

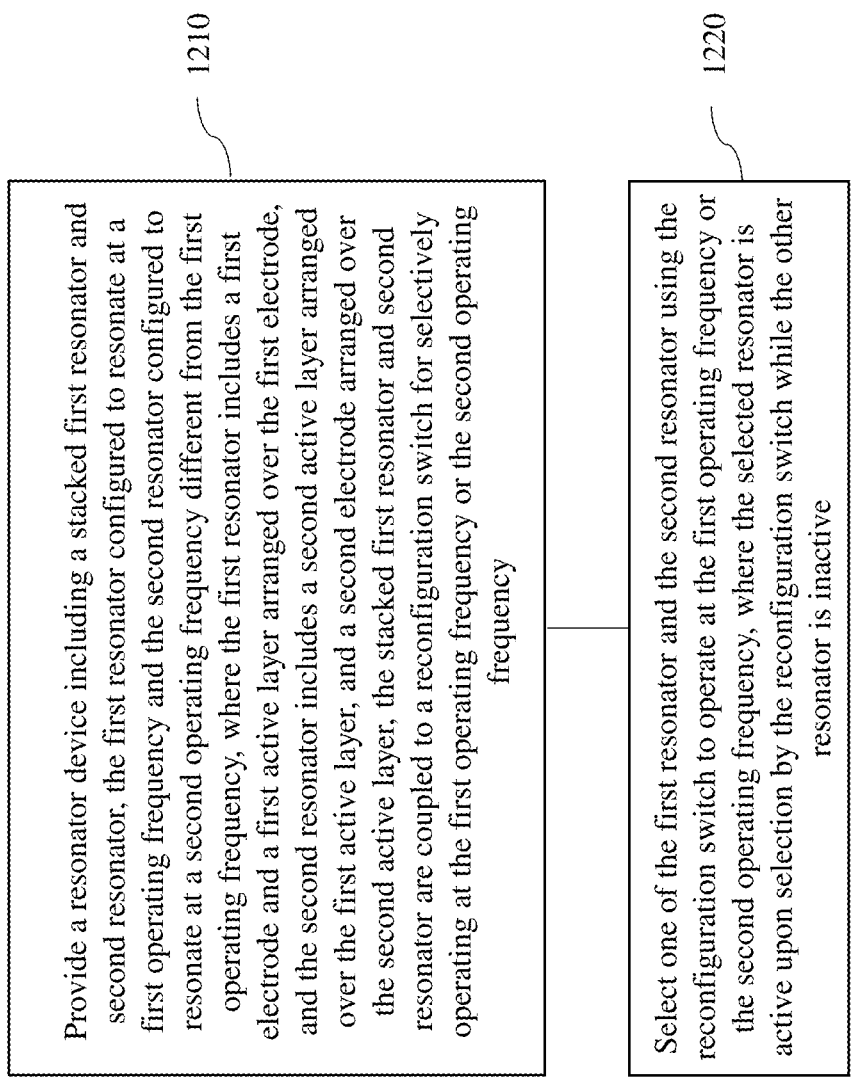

US 10,979,019 B2

RECONFIGURABLE RESONATOR DEVICES, METHODS OF FORMING RECONFIGURABLE RESONATOR DEVICES, AND OPERATIONS THEREOF

TECHNICAL FIELD

The present disclosure relates generally to resonator devices, and more particularly to reconfigurable resonator devices coupled to reconfiguration switches.

BACKGROUND

Acoustic resonators are generally non-programmable. For example, operating frequencies of the acoustic resonators are defined by material properties and electrode design, and are hardwired after fabrication. As such, the operating frequencies of the acoustic resonators is not tunable or cannot be changed once it is fabricated. In various applications, multiple resonator devices or filters are required in order to perform multiple functions requiring different operating frequencies. For example, among other things, this results in an arithmetic increase of area of acoustic filter chips to accommodate for more frequency bands, for example, in radio frequency (RF) front end modules, leading to larger modules. For example, multiple filter chips of a system-in-package (SiP) are packaged in the RF front end modules, resulting in a larger footprint. In some applications, resonance frequencies are modified by hybridization with passive elements to tune the coupling coefficients. In other applications, such as transducer or sensor applications, the devices are limited to single-frequency operation which limits their applications. In such cases, arrays of transducers with varieties of sizes are employed to deal with multi-frequency applications, leading to larger devices as described.

From the foregoing discussion, it is desirable to provide reconfigurable resonator devices.

SUMMARY

Embodiments generally relate to resonator devices and method for forming the resonator devices. According to various embodiments, a resonator device including a stacked first resonator and second resonator is provided. The first resonator is configured to resonate at a first operating frequency, and the second resonator is configured to resonate at a second operating frequency different from the first operating frequency. The first resonator includes a first electrode and a first active layer arranged over the first electrode. The second resonator includes a second active layer arranged over the first active layer, and a second electrode arranged over the second active layer. The stacked first resonator and second resonator are coupled to a reconfiguration switch for selectively operating at the first operating frequency or the second operating frequency. One of the first resonator and the second resonator is active upon selection by the reconfiguration switch, while the other resonator is inactive.

According to various embodiments, a method for forming a resonator device is provided. The method includes defining a first operating frequency and a second operating frequency of the resonator device. The first operating frequency is different from the second operating frequency. A stacked first resonator and second resonator is arranged to form the resonator device where the first resonator is configured to resonate at the first operating frequency and the second resonator is configured to resonate at the second operating frequency. The first resonator includes a first electrode and a first active layer arranged over the first electrode. The second resonator includes a second active layer arranged over the first active layer, and a second electrode arranged over the second active layer. The stacked first resonator and second resonator is coupled to a reconfiguration switch for selectively operating at the first operating frequency or the second operating frequency. One of the first resonator and the second resonator is active upon selection by the reconfiguration switch, while the other resonator is inactive.

According to various non-limiting embodiments, a method of operating a resonator device is provided. The method includes providing a resonator device having a stacked first resonator and second resonator, where the first resonator is configured to resonate at a first operating frequency and the second resonator is configured to resonate at a second operating frequency different from the first operating frequency, and the stacked first resonator and second resonator are coupled to a reconfiguration switch for selectively operating at the first operating frequency or the second operating frequency. The method further includes selecting one of the first resonator and the second resonator using the reconfiguration switch to operate at the first operating frequency or the second operating frequency. The selected resonator is active upon selection by the reconfiguration switch, while the other resonator is inactive.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIG. 4 shows a simplified cross-sectional view of an embodiment of a device having the stacked first and second resonators and the reconfiguration switch, and a top view of first and second reconfiguration switches;

FIG. 12 shows a block diagram of an exemplary method of operating a device.

DETAILED DESCRIPTION

Figure 1A:
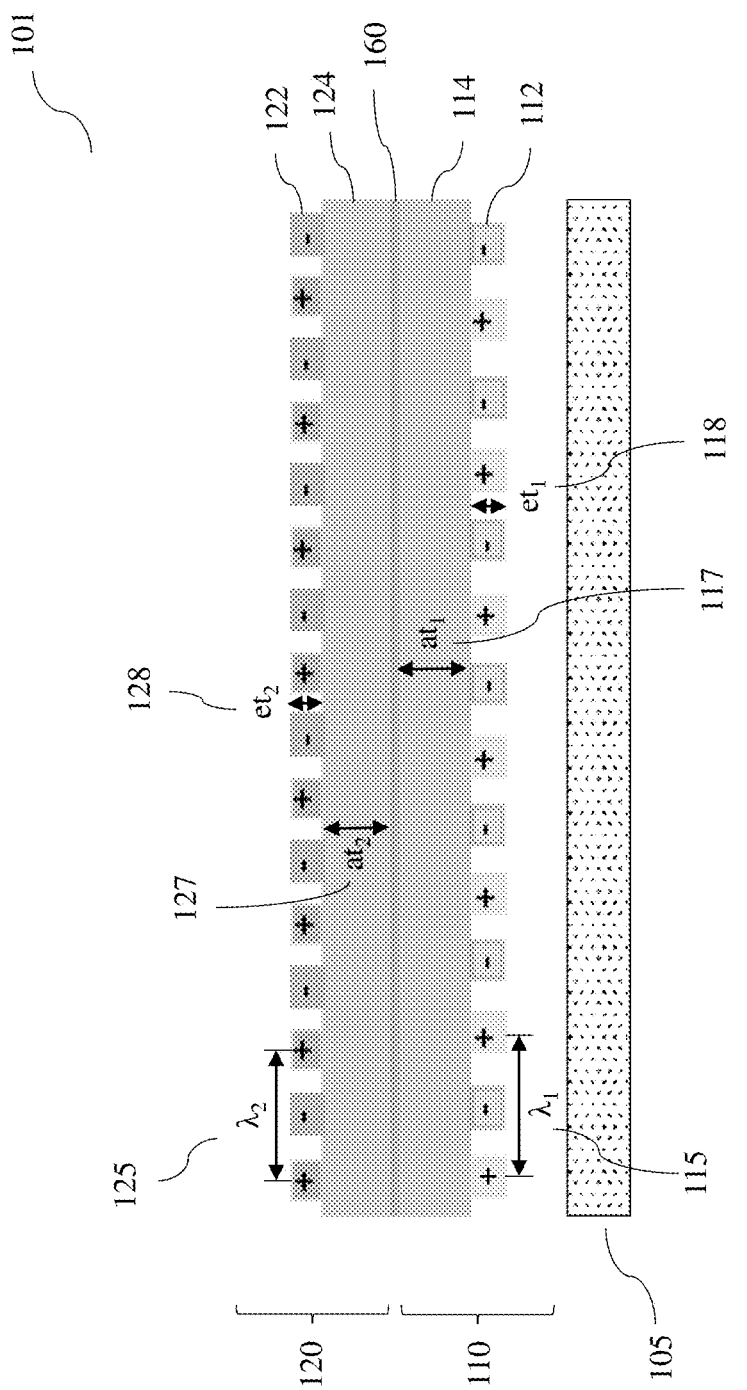
FIG. 1A shows a simplified cross-sectional view of an embodiment of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic, or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to resonator devices. More particularly, embodiments relate to acoustic resonator devices, which may be reconfigurable. According to various non-limiting embodiments, a resonator device may include a stacked first resonator and second resonator. For example, the resonator device may have a dual resonator structure with a stacked first resonant section and second resonant section. The first and second resonators may have a back-to-back configuration, as will be described. Each of the first resonator and the second resonator may include an electrode and an active layer. For example, the active layer may be an acoustic layer for converting electrical signals into mechanical or acoustic waves. The active layer may be, or may include, a piezoelectric layer. For example, the resonator device may convert electrical signals into acoustic waves by piezoelectric effect. Other types of materials for the active layers which may be able to convert electrical signals to mechanical waves based on other types of transduction other than piezoelectric effect may be used in other embodiments.

The first resonator may be configured to resonate at a first operating frequency (or first target operating frequency) and the second resonator may be configured to resonate at a second operating frequency (or target second operating frequency) different from the first operating frequency. The stacked first resonator and second resonator may be coupled to a reconfiguration switch for selectively operating at the first operating frequency or the second operating frequency. One of the first resonator and the second resonator may be active upon selection by the reconfiguration switch while the other resonator may be inactive. In other words, the resonator device may be reconfigured to operate at the first operating frequency or the second operating frequency by selecting one of the first resonator and the second resonator using the reconfiguration switch.

The reconfiguration switch may be operable in different configuration or operation states. According to various non-limiting embodiments, the reconfiguration switch may be operable in a first operation mode and a second operation mode. For example, the first operation mode may be to select the first resonator, while the second operation mode may be to select the second resonator. Alternatively, the first operation mode may be to select the second resonator, while the second operation mode may be to select the first resonator. The reconfiguration switch may be an electrical switch. The reconfiguration switch may include at least a first switch and a second switch. The first switch and the second switch may be two separate components which may be operated or configured independently. The electrodes of each of the first resonator and the second resonator may both be electrically connected to the first switch and the second switch. Other number of switches may also be used in other embodiments.

The resonator device may be a dual-frequency resonator device, in a non-limiting embodiment. The resonator device may be incorporated into or used with various types of devices, such as resonators, filters, transducers or other frequency-selective devices in various non-limiting examples. The resonator device may advantageously reduce footprint for multi-frequency applications. Further, the resonator devices may be designed and fabricated for arbitrary coupling of a combination of operating frequencies.

FIG. 1A shows a simplified cross-sectional view of an embodiment of a device 100. In various non-limiting embodiments, the device 100 may be, or include, a resonator device 101. For example, the device 100 may include a resonator device 101 for generating acoustic waves. The resonator device 101 may include a stacked first resonator 110 and second resonator 120. For example, the second resonator 120 may be stacked over the first resonator 110. Alternatively, the first resonator 110 may be stacked over the second resonator 120. The first resonator 110 may be configured to resonate at a first operating frequency $f_1$, and the second resonator 120 may be configured to resonate a second operating frequency $f_2$ different from the first operating frequency.

Figure 1B:
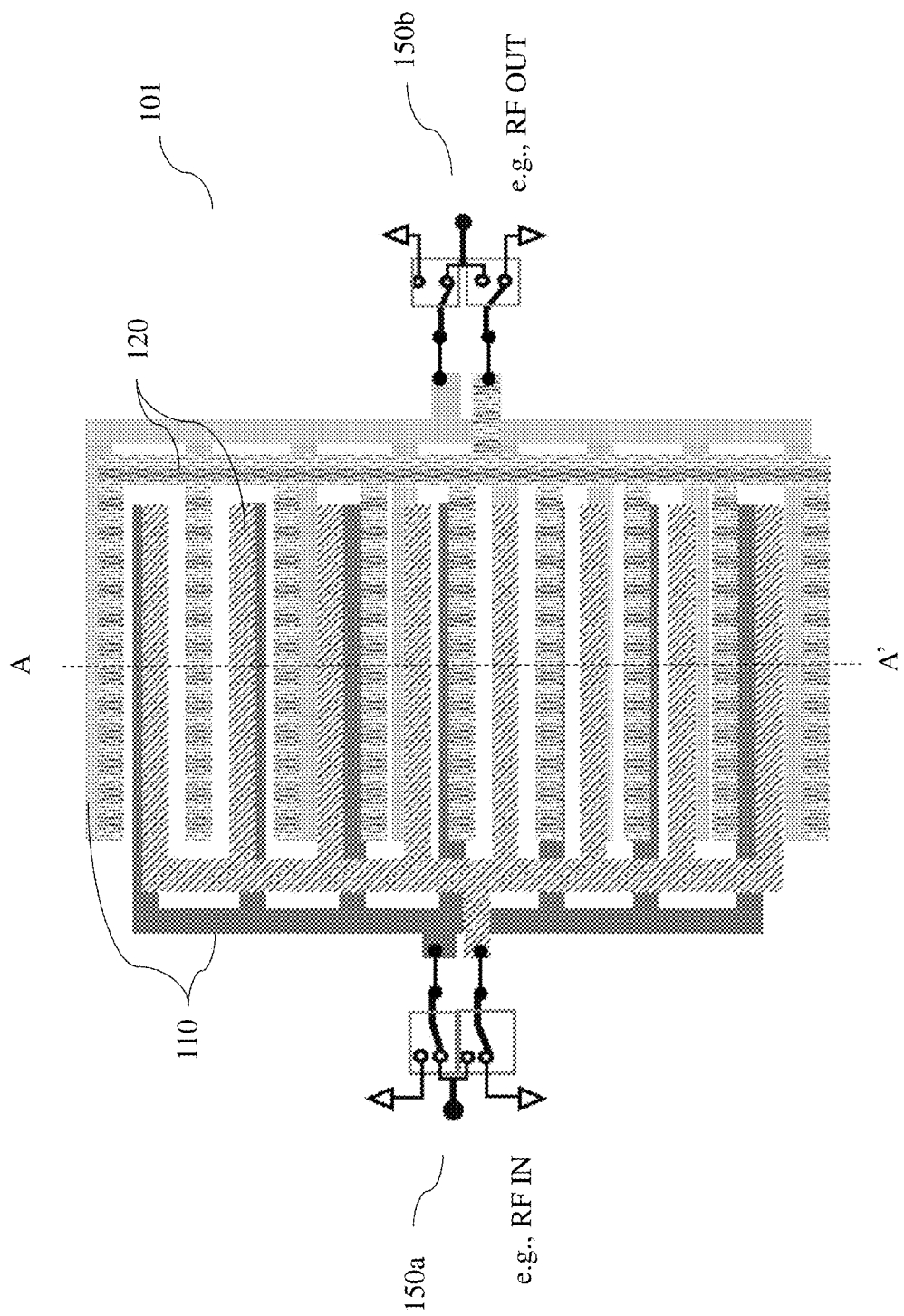
FIG. 1B shows a simplified top view of an embodiment of the device.

The stacked first and second resonators 110 and 120 may be arranged over a substrate 105. The first resonator 110 may include a first electrode 112 and a first active layer 114, while the second resonator 120 may include a second electrode 122 and a second active layer 124. As illustrated in FIG. 1B, the first active layer 114 may be arranged over the first electrode 112, the second active layer 124 may be arranged over the first active layer 114, and the second electrode 122 may be arranged over the second active layer 124. The first electrode 112 and the first active layer 114 form the first resonant section of the resonator device 101, while the second electrode 122 and the second active layer 124 form the second resonant section of the resonator device 101. The non-limiting embodiment described in FIG. 1A, with respect to the first resonator 110 and the second resonator 120 is known as a back-to-back configuration, i.e. where the first active layer 114 and the second active layer 124 are arranged "back-to-back" or one over the other.

According to various non-limiting embodiments, each of the first electrode 112 and the second electrode 122 may be, or include, a set of interdigitated electrodes having electrode fingers disposed between at least two electrode branches applied with different electric potential (e.g., RF potential). The first electrode 112 may be a first interdigitated electrode having an electrode pitch or finger pitch 115 (denoted as $\lambda_1$), while the second electrode 122 may be a second interdigitated electrode having an electrode pitch or finger pitch 125 (denoted as $\lambda_2$). For example, an electrode pitch may be the separation distance between two electrode fingers of the same branch of that electrode, which determines a wavelength of the resonant frequency (or the target operating frequency) of a resonator. By applying electrical signals on the first electrode 112 and/or the second electrode 122, a resonant frequency may be excited. In various non-limiting embodiments, the electrode pitch 115 of the first electrode 112 may be designed (or arranged or provided) based on the first operating frequency $f_1$ of the first resonator 110 (e.g., first desired or target operating frequency of a dual-frequency resonator), while the electrode pitch 125 of the second electrode 122 may be designed (or arranged or provided) based on the second operating frequency $f_2$ of the second resonator 120 (e.g., second desired or target operating frequency of the dual-frequency resonator). The first electrode 112 may be arranged to have the electrode pitch 115, which is different from the electrode pitch 125 of the second electrode 122 (i.e., $\lambda_1 \neq \lambda_2$).

As described, an active layer converts electrical signals into acoustic waves. In various non-limiting embodiments, each of the first active layer 114 and the second active layer 124 may be, or include, one or more piezoelectric layers. In other embodiments, the first active layer 114 and the second active layer 124 may be formed of other materials suitable for converting electrical signals into acoustic waves.

According to various non-limiting embodiments, a thickness of each of the first active layer 114 and the first electrode 112 may be provided (or formed) based on the second operating frequency $f_2$ of the second resonator 120, and a thickness of each of the second active layer 124 and the second electrode 122 may be provided (or formed) based on the first operating frequency $f_1$ of the first resonator 110. The thickness of the first active layer 114 and the thickness of the second active layer 124 may be different, in a non-limiting embodiment. Additionally, the thickness of the first electrode 112 and the thickness of the second electrode 122 may be different, in a non-limiting embodiment.

As illustrated in FIG. 1A, the first active layer 114 may have a thickness 117 (denoted as $at_1$), while the second active layer 124 may have a thickness 127 (denoted as $at_2$). According to various non-limiting embodiments, the thickness 117 of the first active layer 114 is about a quarter of a wavelength of the second operating frequency $f_2$ of the second resonator 120, and the thickness 127 of the second active layer 124 is about a quarter of a wavelength of the first operating frequency $f_1$ of the first resonator 110. For example, in the case the wavelengths of the first operating frequency $f_1$ and the second operating frequency $f_2$ is $\lambda_1$ and $\lambda_2$ respectively (e.g., determined by the first electrode 112 having the electrode pitch 115, $\lambda_1$, and the second electrode 122 having the electrode pitch 125, $\lambda_2$), the thickness 117 of the first active layer 114 is $\lambda_2/4$, while the thickness 127 of the second active layer 124 is $\lambda_1/4$. The first active layer 114 and the second active layer 124 may have other thickness configurations in other embodiments.

As for the first and second electrodes, the first electrode 112 may have a thickness 118 (denoted as $et_1$), while the second electrode 122 may have a thickness 128 (denoted as $et_2$). According to various non-limiting embodiments, the thickness 118 of the first electrode 112 is about a quarter of a wavelength of the second operating frequency $f_2$ of the second resonator 120, and the thickness 128 of the second electrode 122 is about a quarter of a wavelength of the first operating frequency $f_1$ of the first resonator 110. For example, in the case the wavelengths of the operating frequency $f_1$ and the second operating frequency $f_2$ is $\lambda_1$ and $\lambda_2$ respectively (e.g., determined by the first electrode 112 having the electrode pitch 115, $\lambda_1$, and the second electrode 122 having the electrode pitch 125, $\lambda_2$), the thickness 118 of the first electrode 112 is $\lambda_2/4$, while the thickness 128 of the second electrode 122 is $\lambda_1/4$. The first electrode 112 and the second electrode 122 may have other thickness configurations in other embodiments.

The layers of each of the first and second resonators 110 and 120 may be alternatingly formed of materials having high or low acoustic impedances (Z). For example, in the case an electrode of resonator 110 or resonator 120 (e.g., first electrode 112, second electrode 122) is formed of a material having a low acoustic impedance, the active layer (e.g., first active layer 114, second active layer 124) may be formed of a material having a high acoustic impedance. Alternatively, in the case an electrode is formed of a material having a high acoustic impedance, the active layer may be formed of a material having a low acoustic impedance. In a non-limiting example embodiment, the first electrode 112 and the second electrode 122 may be formed of high Z molybdenum (Mo), tungsten (W), or combinations thereof, while the first active layer 114 and the second active layer 124 may be formed of low Z aluminum nitride (AlN), scandium-doped AlN (ScAlN), lithium niobate (LiNbO$_3$), lithium tantalate (LiTa$_2$O$_3$), or combinations thereof. Providing the stacked first electrode 112, first active layer 114, second active layer 124, and second electrode 122 alternatingly formed of materials having high or low acoustic impedances enables acoustic impedance mismatch between the stacked materials of the first resonator 110 and the second resonator 120. The first electrode 112 and the second electrode 122 may be formed of the same or different materials. Similarly, the first active layer 114 and the second active layer 124 may be formed of the same or different materials.

According to various non-limiting embodiments, a conductive interposer layer 160 may be arranged between the first resonator 110 and the second resonator 120. In a non-limiting embodiment, the conductive interposer layer 160 may be a high acoustic impedance conductor such as W and/or Mo. As illustrated, the conductive interposer layer 160 may be arranged between the first active layer and the second active layer 114 and 124. The conductive interposer layer 160 may be configured to decouple the first resonator 110 and the second resonator 120. For example, the conductive interposer layer 160, which is formed of a different material from the first active layer and the second active layer 114 and 124 with different sound velocity and different density, introduces an acoustic impedance mismatch, therefore serves as a mechanical decoupler of the first resonator 110 and the second resonator 120. Further, the conductive interposer layer 160 may enhance the coupling coefficient ($k^2$ eff) of the first resonator 110 and the second resonator 120. An electric field may be induced between the electrodes (e.g., the first electrode 112 and/or the second electrode 122) and the interposer layer 160. Additionally, for some electric boundary conditions (electrical potential) of the interposer layer 160 such as a floating interposer, $k^2$eff may be enhanced. The conductive interposer layer 160 enhances the electric field coupled across an active layer, thus improving the electromechanical transduction. In some cases, the enhancement of $k^2$eff may also depend on the thickness of an active layer. For example, in the case of a resonator having a thin active layer (e.g., active layer having a thickness below $0.5\lambda$), the conductive interposer layer 160 may enhance the $k^2$eff of the resonator. The conductive interposer layer 160 may be formed of the same material as the first electrode 112 and/or the second electrode 122, in a non-limiting embodiment.

FIG. 1B shows a simplified top view of the device 100. For example, the cross-sectional view of the device 100 as shown in FIG. 1A may be along the line AA' of the device 100 as shown in FIG. 1B. The device 100 may be, or includes, the resonator device 101 having the stacked first and second resonators 110 and 120 as described with respect to FIG. 1A. The active layers of the first and second resonators 110 and 120 are not shown in FIG. 1B. According to various non-limiting embodiments, the stacked first resonator 110 and second resonator 120 may be coupled to a reconfiguration switch 150 for selectively operating at the first operating frequency $f_1$ or the second operating frequency $f_2$. The reconfiguration switch 150 may be electrically connected to electrical ports such as input/output ports or two input ports, in a non-limiting example. According to various non-limiting embodiments, the reconfiguration switch 150 may be, or include, at least a first reconfiguration switch 150a and a second reconfiguration switch 150b. For example, the first reconfiguration switch 150a may be coupled to an input port while the second reconfiguration switch 150b may be coupled to an output port. It is understood that other numbers of switches and configuration of the switches may also be used. One of the first resonator 110 and/or the second resonator 120 is active upon selection by the reconfiguration switch 150, while the other resonator is inactive. Upon selection by the reconfiguration switch 150, the active resonator may be supplied with an electrical signal, such as an RF signal.

The reconfiguration switch 150 enables the resonator device 101 to switch between the first operating frequency and the second operating frequency by selectively operating the first resonator 110 or the second resonator 120. The first resonator 110 or the second resonator 120 may be selectively operated depending on an operation mode (or configuration state) of the reconfiguration switch. According to various non-limiting embodiments, a dual-frequency resonator device may be provided which delivers desired frequencies based on selection of a resonator section from a stacked resonator having first and second resonator sections, while the other resonant section is in an inactive state.

Additionally, providing the first active layer 114 and/or the first electrode 112 having about quarter wavelength thicknesses of the target operating frequency $f_2$ of the second resonator 120 (or opposite resonator of the back-to-back resonator device 101) advantageously enables acoustic decoupling of frequency $f_2$ into frequency $f_1$ port in the case the frequency $f_2$ (or second resonator 120) is selected. For example, when the second resonator 120 is selected by the reconfiguration switch 150, the first active layer 114 and/or the first electrode 112 of the inactive resonator (the first resonator 110) may serve as an acoustic reflector to reduce or eliminate acoustic coupling of frequency $f_2$ into frequency $f_1$ port. Similarly, providing the second active layer 124 and/or the second electrode 122 having about quarter wavelength thicknesses of the target operating frequency $f_1$ of the first resonator 110 (or opposite resonator of the back-to-back resonator device 101) advantageously enables acoustic decoupling of frequency $f_1$ into frequency $f_2$ port in the case the frequency $f_1$ (or first resonator 110) is selected. For example, when the first resonator 110 is selected by the reconfiguration switch 150, the second active layer 124 and/or the second electrode 122 of the inactive resonator (the second resonator 120) may serve as an acoustic reflector to reduce or eliminate acoustic coupling of frequency $f_1$ into frequency $f_2$ port.

The first and second resonator 110 and 120 of the resonator device 101 may operate in any one of Surface Acoustic Wave (SAW), Lamb-wave, bulk acoustic wave (BAW), mechanical, or other wave modes. According to various non-limiting embodiments, the resonator devices may be part of a filter, a transducer or other frequency-selective devices.

Figure 1C:
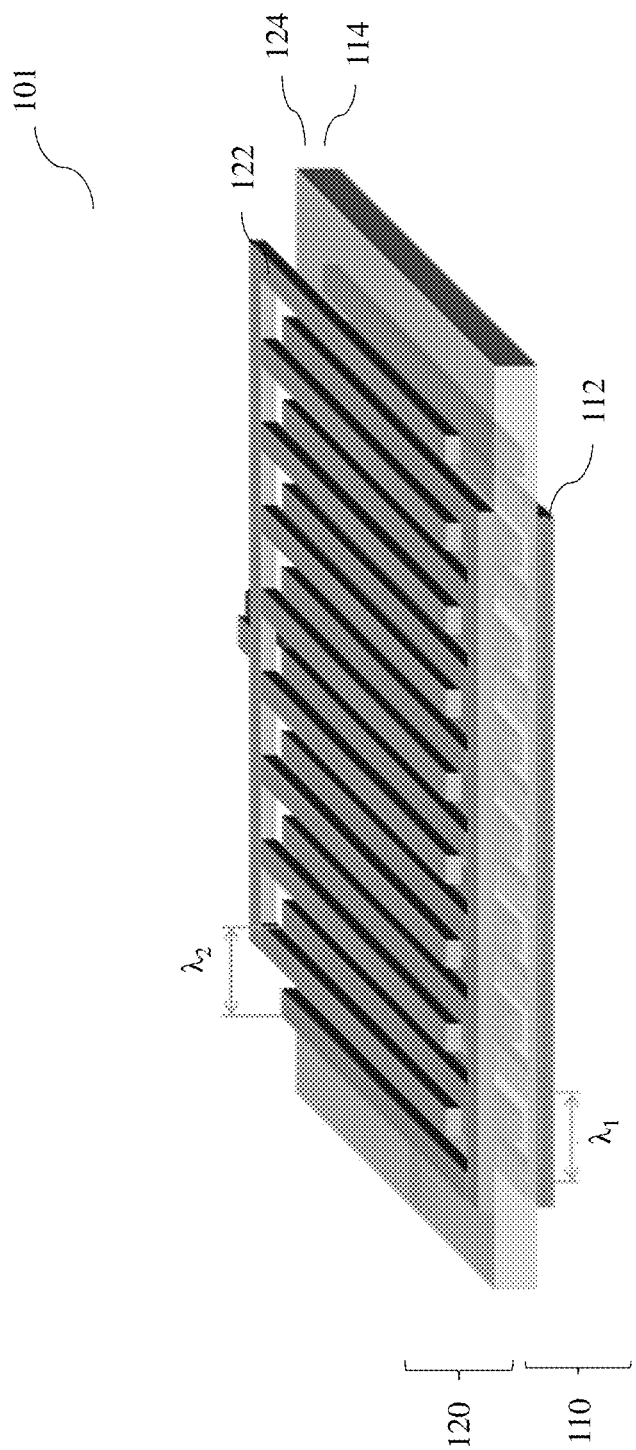
FIG. 1C illustrates a simplified perspective view of stacked first and second resonators of a resonator device.

FIG. 1C illustrates a simplified perspective view of the stacked first and second resonators 110 and 120 of the resonator device 101.

Figure 1D:
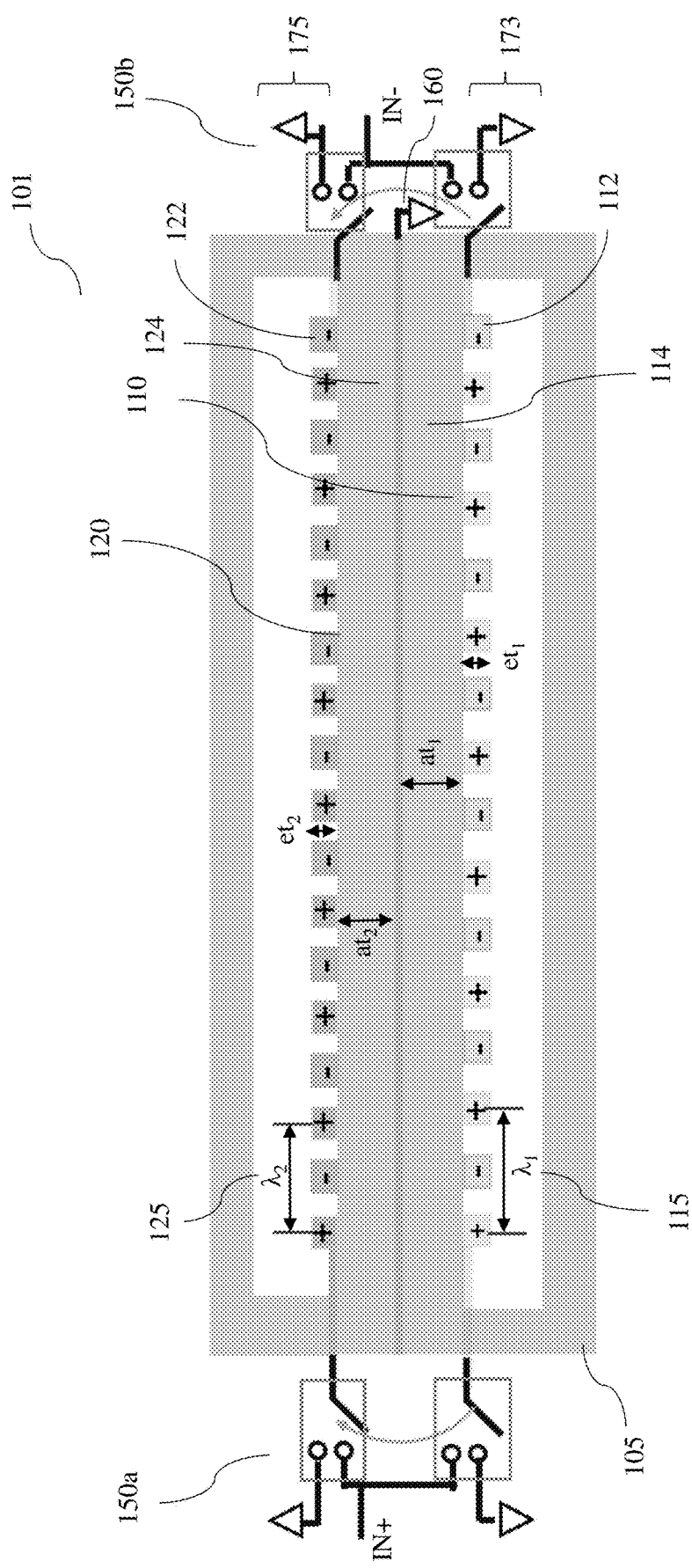
FIG. 1D shows a simplified cross-sectional view of another embodiment of the device.

FIG. 1D shows a simplified cross-sectional view of another embodiment of the device 100. The device 100 includes the resonator device 101 having the stacked first and second resonators 110 and 120. The stacked first and second resonators 110 and 120 may be arranged over the substrate 105. As shown, the first and second resonators 110 and 120 may both be coupled to the reconfiguration switch 150. The reconfiguration switch 150 may reconfigure the operation of the resonator device 101. As described, the reconfiguration switch 150 may selectively operate the resonator device 101 at the first operating frequency $f_1$ or the second operating frequency $f_2$. The reconfiguration switch 150 may be used to select one of the first resonator 110 and/or the second resonator 120 such that one of the first resonator and the second resonator is active upon selection by the reconfiguration switch, while the other resonator is inactive. For example, the reconfiguration switch 150 may be operable in a first operation mode or a second operation mode, where in the first operation mode, the first resonator 110 is selected, while the second resonator 120 is inactive. In the second operation mode, the second resonator 120 is selected, while the first resonator 110 is inactive. For example, the reconfiguration switch 150 may be configured to connect RF signal to one resonator while the other resonator is disconnected/grounded.

As described, the reconfiguration switch 150 may be, or include, at least the first reconfiguration switch 150a and the second reconfiguration switch 150b. For example, the first electrode 112 (e.g., first interdigitated electrode) and the second electrode 122 (e.g., second interdigitated electrode) may each be electrically connected to the first reconfiguration switch 150a and the second reconfiguration switch 150b. In a non-limiting embodiment, the first reconfiguration switch 150a and the second reconfiguration switch 150b may be single pole double throw (SPDT) switches. In other embodiments, the first reconfiguration switch 150a and the second reconfiguration switch 150b may be single pole single throw (SPST) switches. For example, each of the first resonator 110 and the second resonator 120 may be electrically connected to different throws of at least one SPDT micro switch or to different throws of at least two SPST switches. Other types of switches may also be used in other embodiments.

In some embodiments, the acoustic resonator device may include one or more acoustic isolation regions (or acoustic reflectors). As illustrated in FIG. 1D, the first resonator 110 may include a first isolation region (or lower isolation structure) 173, while the second resonator 120 may include a second isolation region (or upper isolation structure) 175. The first isolation region 173 may be disposed over the first electrode 112 and the first active layer 114, covering a surface of the first active layer 114 and surrounding the first electrode 112. Similarly, the second isolation region 175 may be disposed over the second electrode 122 and the second active layer 124, covering a surface of the second active layer 124 and surrounding the second electrode 122. The first isolation region 173 and the second isolation region 175 are illustrated as air cavities. However, it should be understood that other types of acoustic isolation regions, such as Bragg mirrors, may also be used.

In a non-limiting embodiment, the conductive interposer layer 160 may be grounded. Alternatively, in other embodiments, the conductive interposer layer 160 may be floating. According to various example embodiments, the first isolation region 173 may be a low Z air cavity or Bragg mirror, the first electrode 112 may be a high Z Mo 58 MRayl or W 90 MRayl, the first active layer 114 may be a low Z (relative to second electrode 122) AlN 40 MRayl, the conductive interposer layer may be a high Z Mo 58 MRayl or W 90 MRayl, the second active layer 124 may be a low Z (relative to second electrode 122) AlN 40 MRayl, the second electrode 122 may be a high Z Mo 58 MRayl or W 90 MRayl, and the second isolation region 175 may be a low Z air cavity or Bragg mirror. The stacked layers, as described, may be alternatingly formed with high and low acoustic impedances.

Figure 2A:
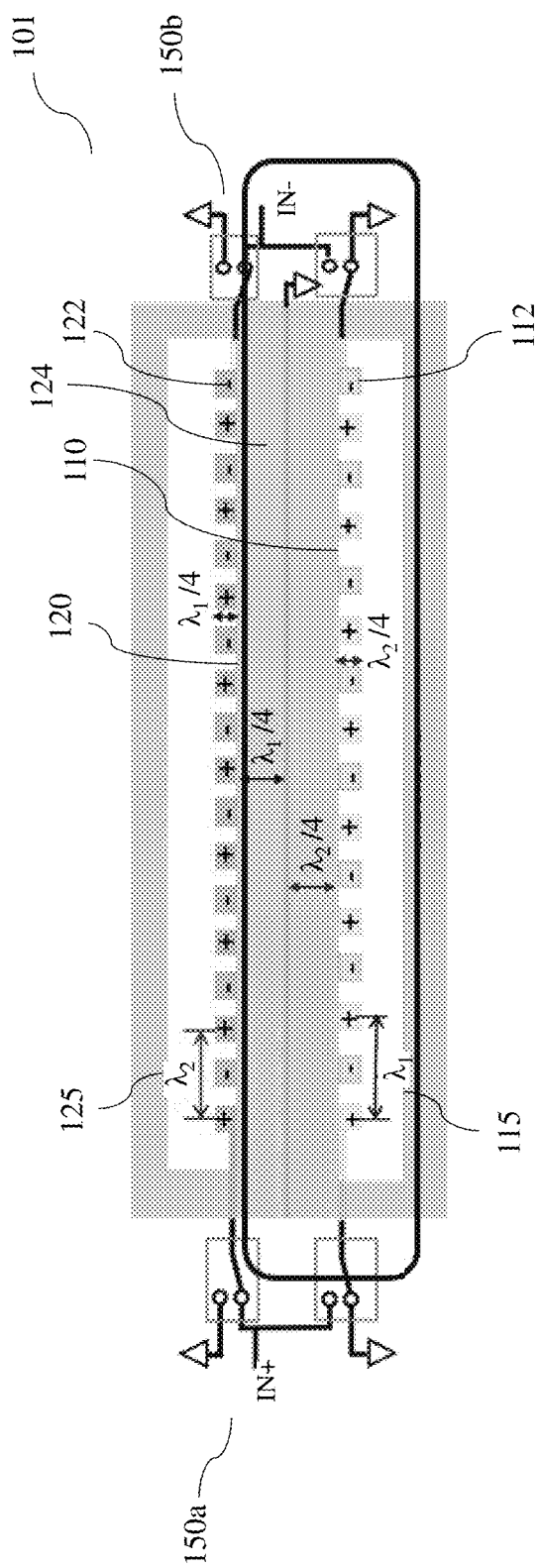
FIG. 2A illustrates a simplified cross-sectional view of an embodiment of the device in a first operation mode of a reconfiguration switch.

FIG. 2A illustrates a simplified cross-sectional view of an embodiment of a device in a first operation mode 200 of the reconfiguration switch 150. The device may be, or include, the resonator device 101. For example, the reconfiguration switch 150 may be switched down to select the first resonator 110. The first resonator 110 may be active upon selection by the reconfiguration switch 150, while the second resonator 120 is inactive. The resonator device 101 may be operated at the first operating frequency $f_1$ in the first operation mode 200. In a non-limiting embodiment, the layers of the second resonator 120 (or inactive resonator) may have quarter-wavelength thicknesses of the operating frequency of the first resonator 110 (or active resonator). For example, in the case the first resonator 110 has a wavelength $\lambda_1$ of the first operating frequency $f_1$ (e.g., determined by the electrode pitch 115, $\lambda_1$, of the first electrode 112), the second electrode 122 and the second active layer 124 may each be provided with thicknesses of $\lambda_1/4$.

Figure 2B:
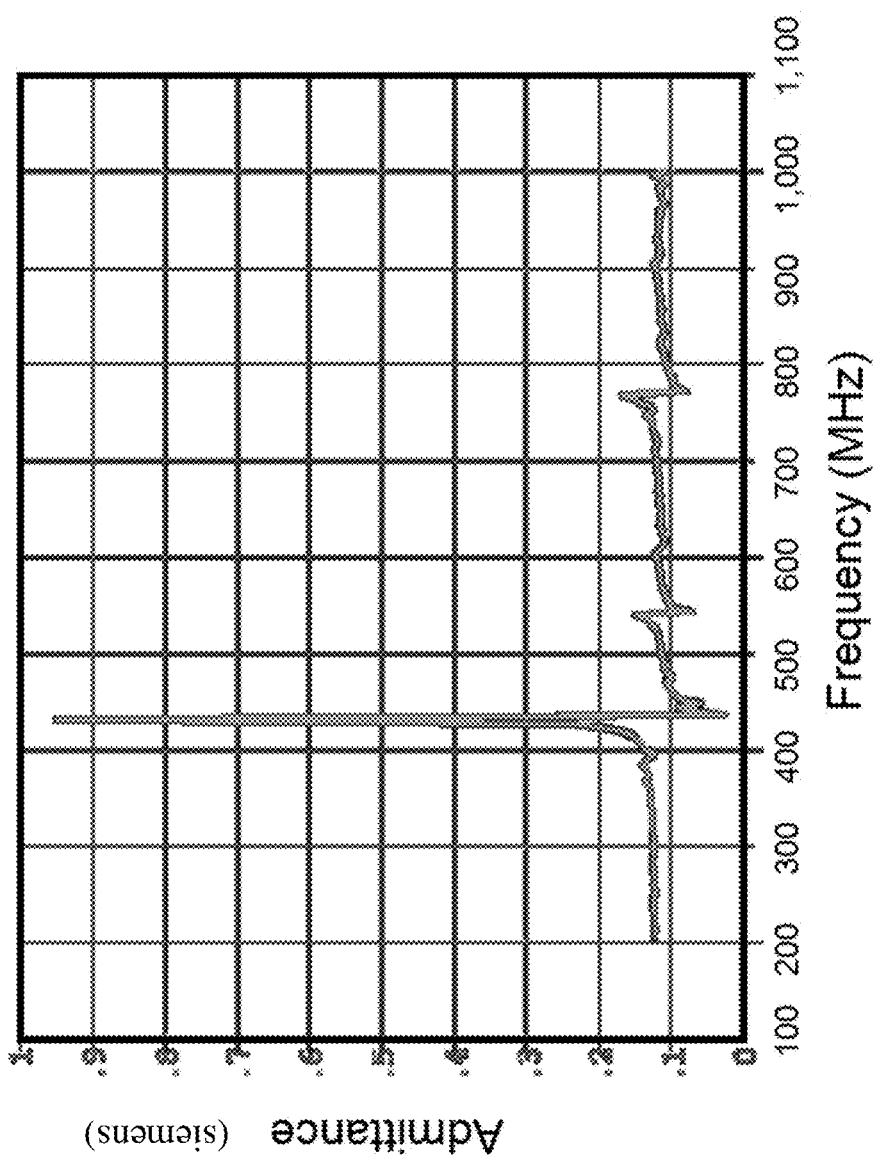
FIG. 2B illustrates an exemplary graph of the frequency response of the device in the first operation mode of the reconfiguration switch.

FIG. 2B illustrates a graph of the frequency response 250 of the device in the first operation mode 200 of the reconfiguration switch 150. For example, the frequency response may correspond to the first resonator 110, which is selected in the first operation mode 200 of the reconfiguration switch 150. The vertical axis of the graph 250 illustrates the magnitude of the output electrical signal. It is noted that good material performance may be achieved when the layers (i.e., active layer and electrode layer) of the inactive resonator (e.g., second resonator 120) are provided with quarter-wavelength thicknesses of the operating frequency of the active resonator (e.g., first resonator 110).

Figure 3A:
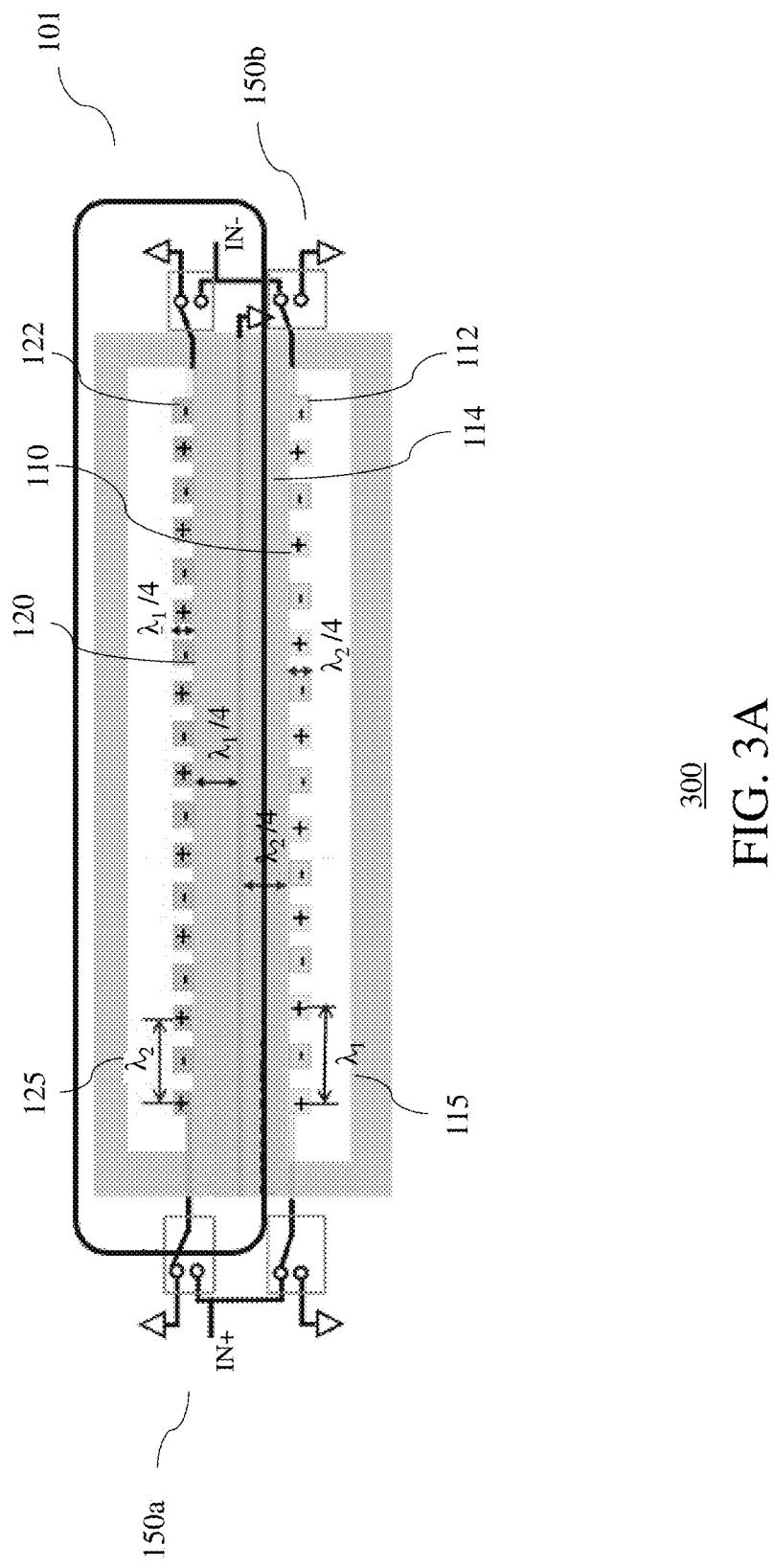
FIG. 3A illustrates a simplified cross-sectional view of an embodiment of the device in a second operation mode of the reconfiguration switch.

FIG. 3A illustrates a simplified cross-sectional view of an embodiment of the device in a second operation mode 300 of the reconfiguration switch 150. The device may be, or include, the resonator device 101. For example, the reconfiguration switch 150 may be switched up to select the second resonator 120. The second resonator 120 may be active upon selection by the reconfiguration switch 150, while the first resonator 110 is inactive. The resonator device may be operated at the second operating frequency $f_2$ in the second operation mode 300. Similar to the first operation mode 200, the layers of the first resonator 110 (or inactive resonator) may have quarter-wavelength thicknesses of the operating frequency of the second resonator 120 (or active resonator). For example, in the case the second resonator 120 has a wavelength $\lambda_2$ of the second operating frequency $f_2$ (e.g., determined by the electrode pitch 125, $\lambda_2$, of the second electrode 122), the first electrode 112 and the first active layer 114 may each be provided with thicknesses of $\lambda_2/4$.

Figure 3B:
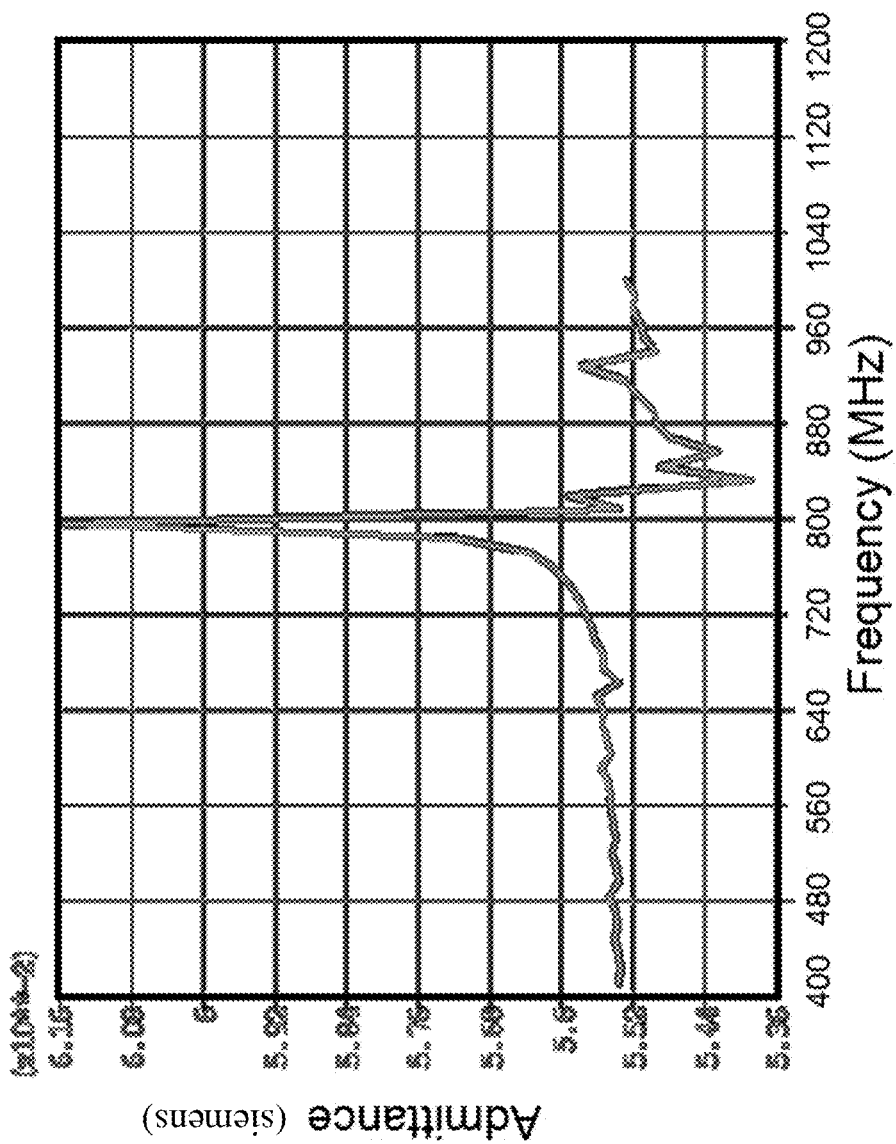
FIG. 3B illustrates an exemplary graph of the frequency response of the device in the second operation mode of the reconfiguration switch.

FIG. 3B illustrates a graph of the frequency response 350 of the resonator device 101 in the second operation mode 300 of the reconfiguration switch 150. For example, the frequency response may correspond to the second resonator 120 selected in the second operation mode 300 of the reconfiguration switch 150. The vertical axis of the graph 350 illustrates the magnitude of the output electrical signal. Similarly, it is noted that good material performance may be achieved when the layers (i.e., active layer and electrode layer) of the inactive resonator (e.g., first resonator 110) are provided with quarter-wavelength thicknesses of the operating frequency of the active resonator (e.g., second resonator 120).

Table 1 shows exemplary values of the first operating frequency $f_1$ of the first resonator 110 and the second operating frequency $f_2$ of the second resonator 120 when such resonators are in the first operation mode 200 and the second operation mode 300, respectively, as well as the corresponding finger pitch of the first interdigitated electrode and finger pitch of the second interdigitated electrode.

TABLE 1

|  | First operation mode | Second operation mode |
| --- | --- | --- |
| v (m/s) - e.g., AlN | 8,000 | 8,000 |
| $f_1$ | 400 MHz | — |
| $f_2$ | — | 800 MHz |
| $\lambda_1$ (m) - finger pitch of first interdigitated electrode | 20 um | — |
| $\lambda_1/4$ (m) - thickness of second active layer (e.g., AlN) | 5.0 um | — |
| $\lambda_1/4$ (m) - thickness of second interdigitated electrode | 3.5 um | — |
| $\lambda_2$ (m) - finger pitch of second interdigitated electrode | — | 10 um |
| $\lambda_2/4$ (m) - thickness of first active layer (e.g., AlN) | — | 2.5 um |
| $\lambda_2/4$ (m) - thickness of first interdigitated electrode | — | 1.75 m |

FIG. 4 shows a simplified cross-sectional view of an embodiment of a device 400 having the stacked first and second resonators 110 and 120 and the reconfiguration switch 150, and a top view of first and second reconfiguration switches 150a and 150b. According to various non-limiting embodiments, the first and second resonators 110 and 120 and the reconfiguration switch 150 may be fabricated monolithically (or arranged) on a single wafer or chip. For example, the first and second resonators 110 and 120 and the reconfiguration switch 150 may be integrated in a monolithic RF front-end module.

As illustrated, the reconfiguration switch 150 may include at least a first reconfiguration switch 150a and a second reconfiguration switch 150b. The first reconfiguration switch 150a and the second reconfiguration switch 150b may be RF silicon-on-insulator (RFSOI) switches. In various non-limiting embodiments, the reconfiguration switch 150 may be formed by CMOS processing over a substrate (not shown). According to various non-limiting embodiments, the first reconfiguration switch 150a and/or the second reconfiguration switch 150b may have a size at least substantially equal to or less than the size of a resonator (e.g., first resonator 110, second resonator 120).

The first and second resonators 110 and 120 may both have separate electrical connections to the first reconfiguration switch 150a and the second reconfiguration switch 150b. The first reconfiguration switch 150a and the reconfiguration second switch 150b may be operated in the first operation mode 200 or the second operation mode 300, as described with respect to FIG. 2A and FIG. 3A.

In other embodiments, the first and second resonators 110 and 120 and the reconfiguration switch 150 may be arranged on different wafers or chips. In yet other embodiments, the first reconfiguration switch 150a and the second reconfiguration switch 150b may be arranged as a system-in-package, system-on-chip, or discrete switches.

Figure 5:
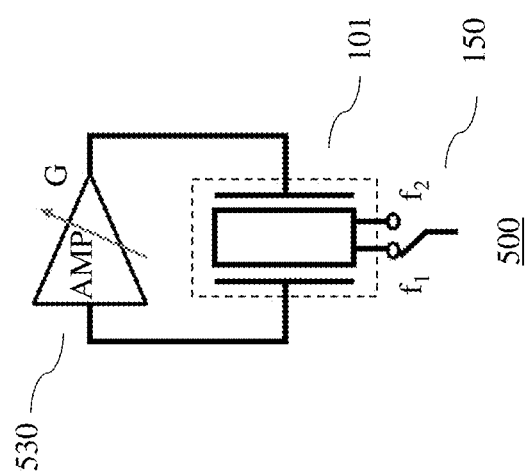
FIG. 5 shows a schematic view of another embodiment of a device.

FIG. 5 shows a schematic view of another embodiment of a device 500. The device 500 may incorporate the resonator device 101 and/or device 400 as described in FIGS. 1A-1D, FIG. 2A, FIG. 3A, and/or FIG. 4. The device 500 may further include an electronic component 530, such as an amplifier, in a non-limiting example.

According to various non-limiting embodiments, the first and second resonators 110 and 120 and the reconfiguration switch 150 may be coupled to the electronic component 530. According to various non-limiting embodiments, the device 500 may be a dual frequency oscillator. The resonator device 101 locks two possible frequencies (e.g., $f_1$ and $f_2$) to create the dual oscillator. The amplitude gain G of the amplifier may be programmable to meet oscillation conditions for both frequencies. The dual oscillator may be applied in or incorporate, inter alia, in an IF mixer (modulation/demodulation), dual-clock generation/timing reference applications.

Figure 6:
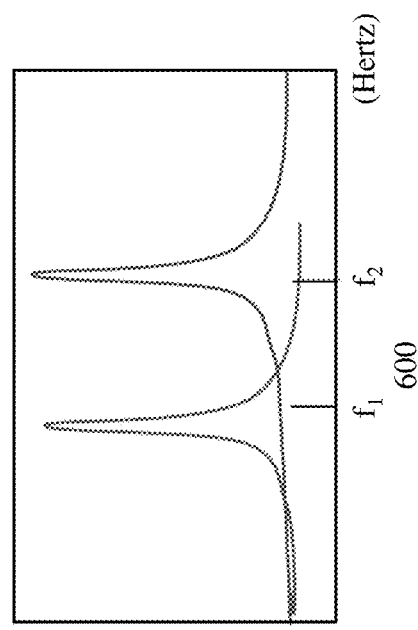
FIG. 6 shows an exemplary graph of a frequency response of the device of FIG. 5.

FIG. 6 shows an exemplary graph of a frequency response 600 of the device 500.

Figure 7:
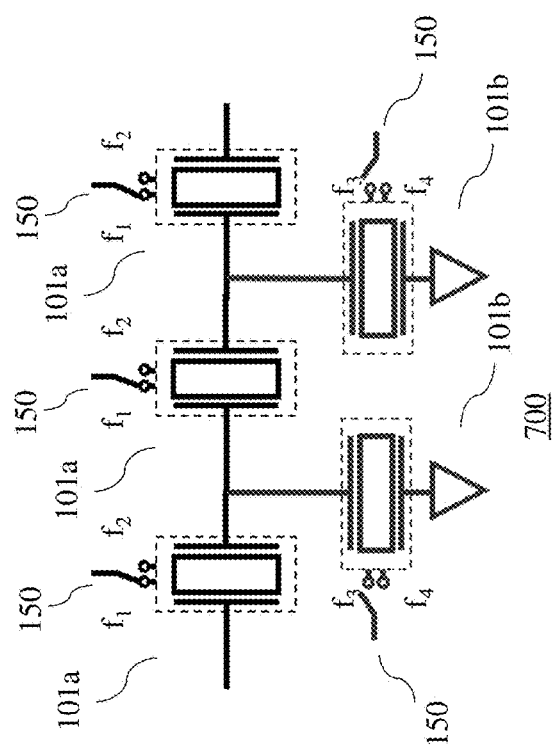
FIG. 7 shows a schematic view of yet another embodiment of a device.

FIG. 7 shows a schematic view of yet another embodiment of a device 700. The device 700 may incorporate a plurality of the resonator devices 101 as described in FIGS. 1A-1D, FIG. 2A, FIG. 3A, and/or FIG. 4.

The device 700 may be a filter device having a ladder filter configuration. The ladder filter may include a first plurality of resonator devices 101a connected in series, and a second plurality of resonator devices 101b connected to the first plurality of resonator devices 101a in shunt. Other configurations may also be used. According to various non-limiting embodiments, the device 700 may be a dual-band filter device. Each resonator device in the filter device 700 may be operable at a first operating frequency or a second operating frequency, which is different from the first operating frequency, depending on the operation mode of its respective reconfiguration switch 150. Each resonator device may have a frequency set including a first operating frequency and a second operating frequency where a frequency set having a first operating frequency and second operating frequency may be the same or different from a first operating frequency and second operating frequency of a different frequency set of a different resonator device. In a non-limiting embodiment, resonator devices 101a may each have a first operating frequency denoted as $f_1$ and a second operating frequency denoted as $f_2$, while resonator devices 101b may each have a first operating frequency denoted as $f_3$ and a second operating frequency denoted as $f_4$. Each of the first operating frequencies $f_1$ and $f_3$ may be the same or different and each of the second operating frequencies $f_2$ and $f_4$ may be the same or different. In an exemplary implementation, pairs of first operating frequencies, and second operating frequencies may be selected using the reconfiguration switch to create two filters. As such, the filter device 700 may behave as frequency channels. For example, pairs of different first operating frequencies $f_1$ and $f_3$ may be respectively selected from the resonator devices 101a and the resonator devices 101b in a first operation state of the reconfiguration switches 150 and pairs of different second operating frequencies $f_2$ and $f_4$ may be respectively selected from the resonator devices 101a and the resonator devices 101b in a second operation state of the reconfiguration switches 150. The reconfiguration switch for each resonator device 101 may be RFSOI switches arranged under the resonator devices/filters, in a non-limiting example. The size of the RFSOI switches may be smaller than the size of the filter device, which advantageously enables footprint gain in the filter device 700.

Figure 8:
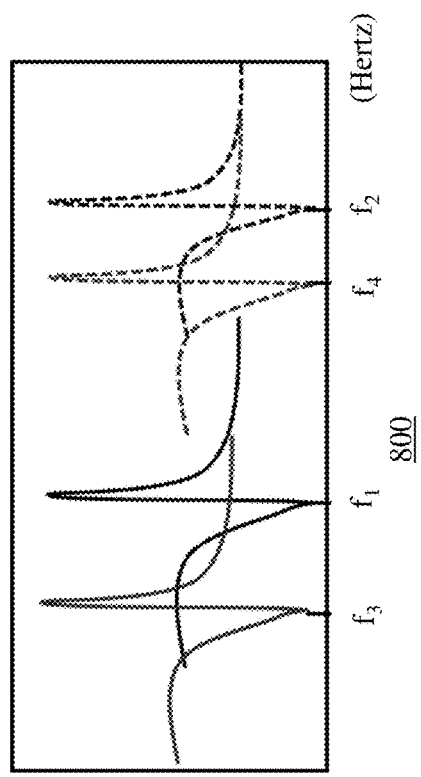
FIG. 8 shows an exemplary graph of the frequency response corresponding to an individual resonator device of the device of FIG. 7.
Figure 9:
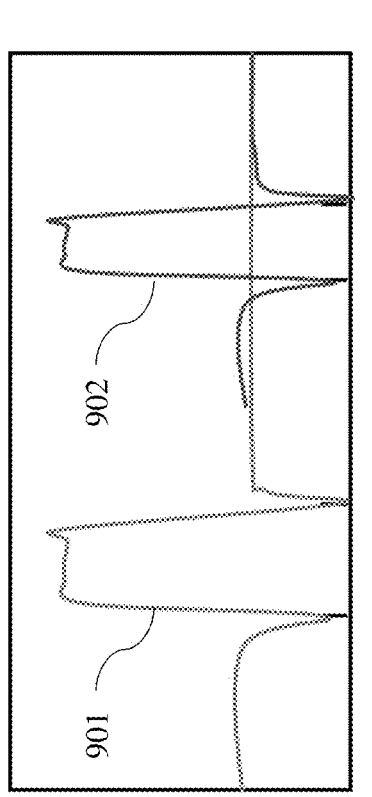
FIG. 9 shows an exemplary graph of the bandpass characteristic of the device of FIG. 7.

FIG. 8 shows an exemplary graph of the frequency response 800 corresponding to an individual resonator device (e.g., resonator device 101a or resonator device 101b) of the filter device 700. The graph illustrates pairs of frequency responses $f_1$ and $f_3$, and $f_2$ and $f_4$ depending on the selected operating frequency from each resonator device 101. FIG. 9 shows an exemplary graph of the bandpass characteristic 900 of the filter device 700. As illustrated, signals may be transmitted between each selected pair 901 of frequencies $f_1$ and $f_3$ and pair 902 of frequencies $f_2$ and $f_4$. For example, the pair of frequencies $f_1$ and $f_3$ may define a first bandwidth, and the pair of frequencies $f_2$ and $f_4$ may define a second bandwidth.

Figure 10:
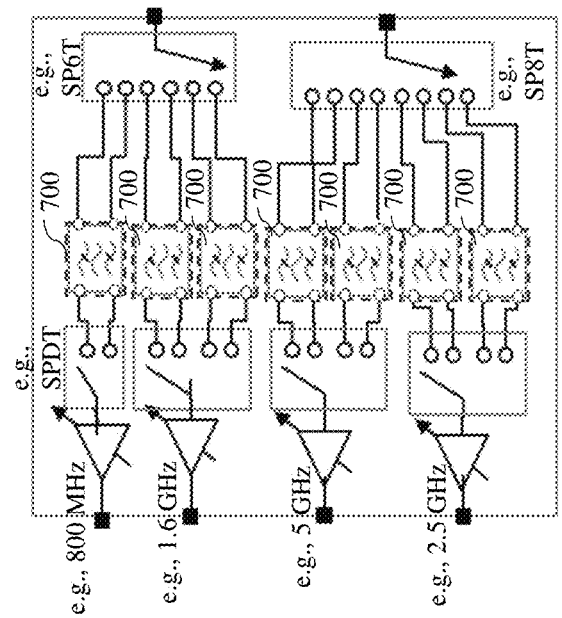
FIG. 10 shows a schematic diagram of another embodiment of a device.

FIG. 10 shows a schematic diagram of another embodiment of a device 1000. The device 1000 may include a plurality of dual-band filter devices 700 having the resonator devices 101 as described in FIGS. 1A-1D, FIG. 2A, FIG. 3A, and/or FIG. 4.

According to various non-limiting embodiments, the device 1000 may be a diversity (DRX) module. Other types of modules may be arranged in other embodiments. Each dual-band filter device 700 may be operable with two different passbands. The number of filter devices employed in the module may be reduced compared to conventional modules for the same number of achievable frequency bands. In other words, the DRX module may be able to accommodate more frequency bands while using less filter devices. For example, the filter footprint may be reduced by at least two times compared to conventional modules.

Figure 11:
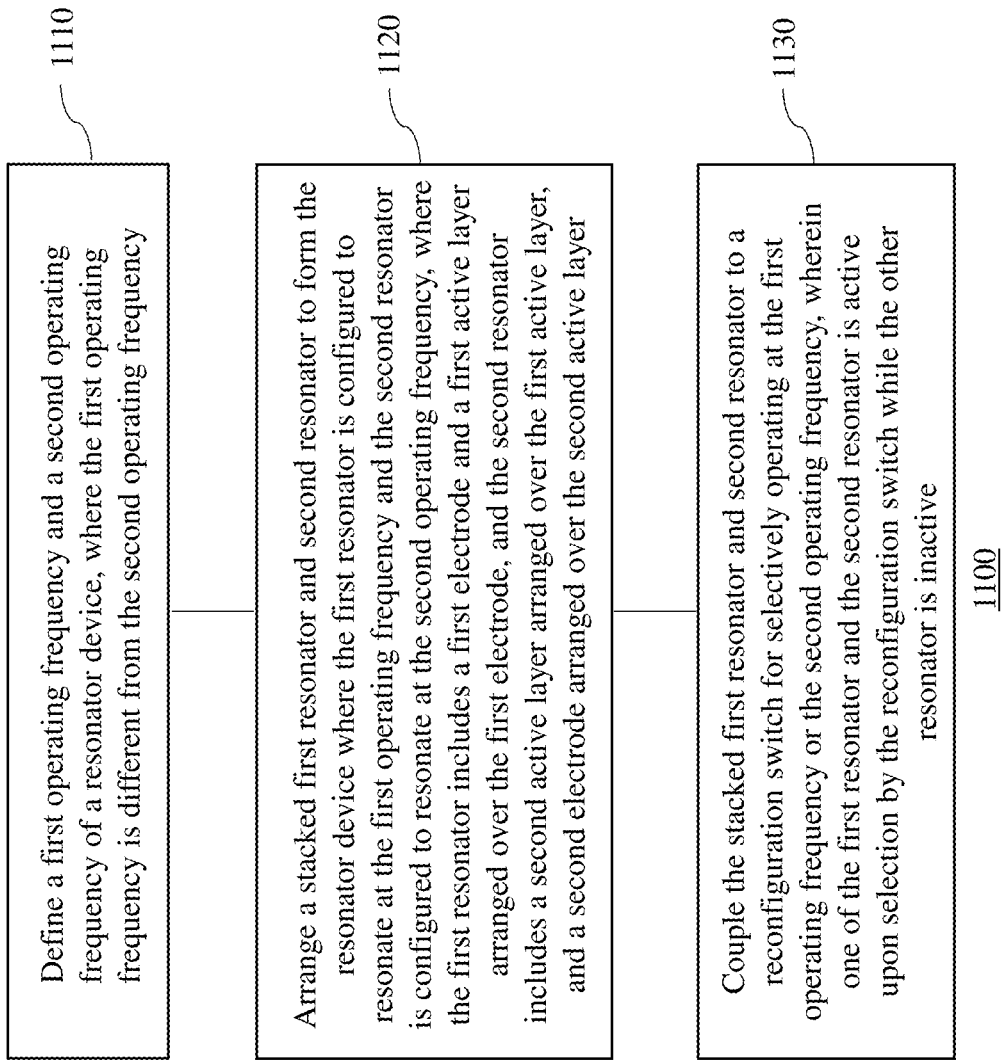
FIG. 11 shows a block diagram of an exemplary process for forming a device.

FIG. 11 shows a block diagram of an exemplary process 1100 for forming a device. The device, for example, may be similar to that described in FIGS. 1A-1D, FIG. 2A, FIG. 3A, and/or FIG. 4. The device may be or include a resonator device.

At 1110, a first operating frequency and a second operating frequency of a resonator device may be defined. The first operating frequency may be different from the second operating frequency.

At 1120, a stacked first resonator and second resonator may be arranged to form the resonator device. The first resonator may be configured to resonate at the first operating frequency and the second resonator may be configured to resonate at the second operating frequency. The first resonator may include a first electrode and a first active layer arranged over the first electrode. The second resonator may include a second active layer arranged over the first active layer, and a second electrode arranged over the second active layer.

At 1130, the stacked first resonator and second resonator may be coupled to a reconfiguration switch for selectively operating at the first operating frequency or the second operating frequency, where one of the first resonator and the second resonator is active upon selection by the reconfiguration switch, while the other resonator is inactive. For example, electrical connections may be provided between each of the first resonator and the second resonator with different throws of at least one SPDT micro switch or to different throws of at least two SPST switches, in accordance with various non-limiting embodiments. The switches may be configured to connect RF signals to one of the first resonator and the second resonator, while the other resonator is disconnected or grounded.

In various non-limiting embodiments, arranging the stacked first resonator and second resonator may include forming interdigitated electrodes for each of the first electrode and the second electrode, where an electrode pitch of the first interdigitated electrode may be formed based on the first operating frequency of the first resonator, and an electrode pitch of the second interdigitated electrode may be formed based on the second operating frequency of the second resonator.

In various non-limiting embodiments, a thickness of each of the first active layer and the first electrode may be formed based on the second operating frequency of the second resonator, and a thickness of each of the second active layer and the second electrode may be formed based on the first operating frequency of the first resonator. In various non-limiting embodiments, the thickness of the first active layer and the thickness of the second active layer may be different.

In various non-limiting embodiments, a thickness of the first active layer may be a quarter of a wavelength of the second operating frequency, and a thickness of the second active layer may be a quarter a wavelength of the first operating frequency.

In various non-limiting embodiments, a thickness of the first electrode may be a quarter of the wavelength of the second operating frequency, and a thickness of the second electrode may be a quarter of the wavelength of the first operating frequency.

In various non-limiting embodiments, each of the first active layer and the second active layer may include one or more piezoelectric layers.

In various non-limiting embodiments, a conductive interposer layer may be arranged between the first resonator and the second resonator, where the conductive interposer layer decouples the first resonator and the second resonator. In various non-limiting embodiments, the conductive interposer layer enhances the coupling coefficient of the first resonator and the second resonator.

In various non-limiting embodiments, a first isolation region may be formed for the first resonator, and a second isolation region may be formed for the second resonator. For example, the first isolation region may be a lower isolation structure of the resonator device, while the second isolation region may be an upper isolation structure of the resonator device.

In various non-limiting embodiments, the first resonator, the second resonator, and the reconfiguration switch may be formed on a single wafer.

FIG. 12 shows a block diagram of an exemplary method 1200 of operating a device. The device may be or include a resonator device. The resonator device, for example, may be similar to that described in FIGS. 1A-1D, FIG. 2A, FIG. 3A, and/or FIG. 4.

At 1210, the resonator device may be provided. The resonator device may include a stacked first resonator and second resonator. The first resonator may be configured to resonate at a first operating frequency and the second resonator may be configured to resonate at a second operating frequency different from the first operating frequency. The stacked first resonator and second resonator may be coupled to a reconfiguration switch for selectively operating at the first operating frequency or the second operating frequency.

At 1220, one of the first resonator and the second resonator may be selected using the reconfiguration switch to operate at the first operating frequency or the second operating frequency, where the selected resonator is active upon selection by the reconfiguration switch, while the other resonator is inactive. According to various non-limiting embodiments, the resonator device may include a conductive interposer layer arranged between the first resonator and the second resonator. The conductive interposer layer decouples the first resonator and the second resonator when the selected resonator from the first resonator and the second resonator is active upon selection, while the other resonator is inactive.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A resonator device comprising:
a stacked first resonator and second resonator, the stacked first resonator configured to resonate at a first operating frequency and the stacked second resonator configured to resonate at a second operating frequency different from the first operating frequency, wherein
the stacked first resonator comprises a first electrode and a first active layer arranged over the first electrode, and
the stacked second resonator comprises a second active layer arranged over the first active layer, and a second electrode arranged over the second active layer, wherein the first electrode is a first interdigitated electrode and the second electrode is a second interdigitated electrode, wherein an electrode pitch of the first interdigitated electrode is arranged based on the first operating frequency of the stacked first resonator, and wherein an electrode pitch of the second interdigitated electrode is arranged based on the second operating frequency of the stacked second resonator; and
wherein the stacked first resonator and second resonator are coupled to a reconfiguration switch for selectively operating at the first operating frequency or the second operating frequency, wherein one of the stacked first resonator and the stacked second resonator is active upon selection by the reconfiguration switch while the other stacked resonator is inactive.

2. The resonator device of claim 1, wherein a thickness of each of the first active layer and the first electrode is formed based on the second operating frequency of the stacked second resonator, wherein a thickness of each of the second active layer and the second electrode is formed based on the first operating frequency of the stacked first resonator, and wherein the thickness of the first active layer and the thickness of the second active layer are different.

3. The resonator device of claim 1, wherein a thickness of the first active layer is a quarter of a wavelength of the second operating frequency, and wherein a thickness of the second active layer is a quarter a wavelength of the first operating frequency.

4. The resonator device of claim 3, wherein a thickness of the first electrode is a quarter of the wavelength of the second operating frequency, and wherein a thickness of the second electrode is a quarter of the wavelength of the first operating frequency.

5. The resonator device of claim 1, wherein each of the first active layer and the second active layer comprises one or more piezoelectric layers.

6. The resonator device of claim 1, further comprising a conductive interposer layer arranged between the stacked first resonator and the stacked second resonator, wherein the conductive interposer layer is configured to decouple the stacked first resonator and the stacked second resonator.

7. The resonator device of claim 1, wherein the stacked first resonator further comprises a first isolation region and the stacked second resonator further comprises a second isolation region.

8. The resonator device of claim 1, wherein the stacked first resonator, the stacked second resonator, and the reconfiguration switch are arranged on a single wafer.

9. The resonator device of claim 1, wherein the reconfiguration switch comprises a first reconfiguration switch and a second reconfiguration switch, and wherein the first electrode and second electrode are both electrically connected to the first reconfiguration switch and the second reconfiguration switch.

10. A method for forming a resonator device, comprising:
defining a first operating frequency and a second operating frequency of the resonator device, wherein the first operating frequency is different from the second operating frequency;
arranging a stacked first resonator and second resonator to form the resonator device where the stacked first resonator is configured to resonate at the first operating frequency and the stacked second resonator is configured to resonate at the second operating frequency, wherein
the stacked first resonator comprises a first electrode and a first active layer arranged over the first electrode, and
the stacked second resonator comprises a second active layer arranged over the first active layer, and a second electrode arranged over the second active layer, wherein the first electrode is a first interdigitated electrode and the second electrode is a second interdigitated electrode, wherein an electrode pitch of the first interdigitated electrode is arranged based on the first operating frequency of the stacked first resonator, and wherein an electrode pitch of the second interdigitated electrode is arranged based on the second operating frequency of the stacked second resonator; and
coupling the stacked first resonator and second resonator to a reconfiguration switch for selectively operating at the first operating frequency or the second operating frequency, wherein one of the stacked first resonator and the stacked second resonator is active upon selection by the reconfiguration switch while the other stacked resonator is inactive.

11. The method of claim 10, wherein arranging the stacked first resonator and second resonator comprises:
forming interdigitated electrodes for each of the first electrode and the second electrode, wherein the electrode pitch of the first interdigitated electrode is formed based on the first operating frequency of the stacked first resonator, and wherein the electrode pitch of the second interdigitated electrode is formed based on the second operating frequency of the stacked second resonator.

12. The method of claim 10, wherein a thickness of each of the first active layer and the first electrode is formed based on the second operating frequency of the stacked second resonator, wherein a thickness of each of the second active layer and the second electrode is formed based on the first operating frequency of the stacked first resonator, and wherein the thickness of the first active layer and the thickness of the second active layer are different.

13. The method of claim 10, wherein a thickness of the first active layer is a quarter of a wavelength of the second operating frequency, and wherein a thickness of the second active layer is a quarter a wavelength of the first operating frequency.

14. The method of claim 10, wherein a thickness of the first electrode is a quarter of the wavelength of the second operating frequency, and wherein a thickness of the second electrode is a quarter of the wavelength of the first operating frequency.

15. The method of claim 10, wherein each of the first active layer and the second active layer comprises one or more piezoelectric layers.

16. The method of claim 10, further comprising arranging a conductive interposer layer between the stacked first resonator and the stacked second resonator, wherein the conductive layer interposer is configured to decouple the stacked first resonator and the stacked second resonator.

17. The method of claim 10, further comprising forming the stacked first resonator, the stacked second resonator, and the reconfiguration switch on a single wafer.

18. A method of operating a resonator device, comprising:
providing a resonator device comprising:
a stacked first resonator and second resonator, the stacked first resonator configured to resonate at a first operating frequency and the stacked second resonator configured to resonate at a second operating frequency different from the first operating frequency, wherein
the stacked first resonator comprises a first electrode and a first active layer arranged over the first electrode, and
the stacked second resonator comprises a second active layer arranged over the first active layer, and a second electrode arranged over the second active layer, wherein the first electrode is a first interdigitated electrode and the second electrode is a second interdigitated electrode, wherein an electrode pitch of the first interdigitated electrode is arranged based on the first operating frequency of the stacked first resonator, and wherein an electrode pitch of the second interdigitated electrode is arranged based on the second operating frequency of the stacked second resonator; and
wherein the stacked first resonator and second resonator are coupled to a reconfiguration switch for selectively operating at the first operating frequency or the second operating frequency; and
selecting one of the stacked first resonator and the stacked second resonator using the reconfiguration switch to operate at the first operating frequency or the second operating frequency, wherein a selected stacked resonator is active upon selection by the reconfiguration switch while the other stacked resonator is inactive.

19. The method of claim 18, wherein the resonator device further comprises a conductive interposer layer arranged between the stacked first resonator and the stacked second resonator, wherein the conductive interposer layer decouples the stacked first resonator and the stacked second resonator when the selected stacked resonator from the stacked first resonator and the stacked second resonator is active upon selection while the other stacked resonator is inactive.

20. The resonator device of claim 1, wherein a thickness of the first active layer and a thickness of the second active layer are different.

* * * * *